United States Patent [19]

Gregory et al.

[11] Patent Number: 5,708,359
[45] Date of Patent: Jan. 13, 1998

[54] INTERACTIVE, STEREOSCOPIC MAGNETIC RESONANCE IMAGING SYSTEM

[75] Inventors: Carl D. Gregory, Champaign; Clinton S. Potter, Ivesdale; Paul C. Lauterbur, Urbana, all of Ill.

[73] Assignee: The Board of Trustees of the University of Illinois, Urbana, Ill.

[21] Appl. No.: 566,970

[22] Filed: Dec. 4, 1995

[51] Int. Cl.[6] .................................................. G01V 3/00
[52] U.S. Cl. ............................................. 324/309; 324/307
[58] Field of Search .................................... 324/309, 307, 324/312, 314, 318, 322; 128/653.2, 653.5

[56] References Cited

U.S. PATENT DOCUMENTS

| | | | |
|---|---|---|---|
| 4,853,769 | 8/1989 | Kollin | 358/88 |
| 4,945,408 | 7/1990 | Medina | 358/88 |
| 5,078,141 | 1/1992 | Suzuki et al. | 128/653.2 |
| 5,155,435 | 10/1992 | Kaufman et al. | 324/309 |
| 5,184,074 | 2/1993 | Kaufman et al. | 324/318 |
| 5,251,635 | 10/1993 | Dumoulin et al. | 128/653.1 |
| 5,512,827 | 4/1996 | Hardy et al. | 324/309 |

*Primary Examiner*—Louis M. Arana
*Attorney, Agent, or Firm*—Woodard, Emhardt, Naughton, Moriarty & McNett

[57] ABSTRACT

Described are a preferred system and method for acquiring magnetic resonance signals which can be viewed stereoscopically in real or near-real time. The preferred stereoscopic MRI systems are interactive and allow for the adjustment of the acquired images in real time, for example to alter the viewing angle, contrast parameters, field of view, or position associated with the image, all advantageously facilitated by voice-recognition software.

17 Claims, 3 Drawing Sheets

INTERACTIVE, STEREOSCOPIC MAGNETIC RESONANCE IMAGING SYSTEM

BACKGROUND OF THE INVENTION

The present invention resides generally in the field of magnetic resonance imaging. More particularly, the present invention relates to stereoscopic magnetic resonance imaging systems and methods.

As further background, magnetic resonance imaging (MRI) has grown in the past two decades to be a well-established means of non-invasively imaging the interior of opaque objects such as live plants, animals and humans. Early work with MRI scanners involved almost exclusively the acquisition of diagnostic information, with procedures being conducted in a "batch" or sequential mode wherein data are acquired over a period of several minutes. These data are then processed and displayed as images or "slices" of an object under study to provide diagnostic information.

More recent developments with MRI have involved 3-dimensional (3D) visualization of objects. These likewise have relied generally on sequential processing. Moreover, 3D visualization implies extremely large data sets and correspondingly long data acquisition times. Such factors lead to difficulties in imaging dynamic processes in objects under study, and in interacting with the object, due to significant time lags which are experienced. These difficulties have in turn impeded the development of MRI systems providing meaningful assistance in image-guided, invasive surgical techniques, despite considerable interest in such techniques and improvements in system design such as open-magnet configurations which permit physicians to operate at a patient's side within the scanner.

In light of the foregoing background, there continue to exist needs for MRI systems and methods which provide for the rapid acquisition and display of MR images, and which provide visual cues to users to facilitate improved interaction with the object under study. The present invention addresses these needs.

SUMMARY OF THE INVENTION

Briefly describing one preferred embodiment of the invention, provided is an interactive, stereoscopic magnetic resonance imaging system for acquiring and displaying in real or near-real time a stereoscopic display of magnetic resonance signals acquired from an object. In accordance with the invention the systems includes static field means for applying a static magnetic field to the object, slice-selection gradient field means for applying a slice-selection magnetic gradient to the object, phase-encoding gradient field means for applying a phase-encoding gradient magnetic field to the object, readout gradient field means for applying a readout gradient magnetic field to the object, radio frequency transmitting means for transmitting a radio pulse to the object, and magnetic resonance signal detection means for detecting magnetic resonance signals from the object. The system also has pulse sequence control means for controlling the various gradient field means, the radio frequency transmitting means, and the magnetic resonance signal detection means, to acquire magnetic resonance signals representing first and second slices of the object, the first and second slices representing stereo pairs. The system further includes interactive control means for controlling the pulse sequence control means to alter said magnetic resonance signals in real or near-real time, e.g. at the end of data acquisition for a line or frame. Processing means are also provided, for processing the magnetic resonance signals to construct a stereoscopic image of the object in real or near-real time. The system also includes display means for displaying the stereoscopic image in real or near-real time. In this fashion, parameters such as view angle, contrast parameters, field of view, position, flip angle, repetition time and resolution can be adjusted in real or near-real time. Such real-time interaction with the magnetic imaging signals is highly important, since in general stereoscopic views in themselves are not sufficient to permit unambiguous perception of unfamiliar structures. The interactive character of the inventive systems and methods permits an operator to augment visual information with other cues such as apparent motion into or out of the plane, changes in contrast and brightness, or additional views from other directions or at different magnifications. All of these cues serve to clarify the perception and understanding of the object under study, much as moving the head or adjusting the illumination might do for a direct visual examination.

A further embodiment of the invention provides a system for controlling a magnetic resonance imaging apparatus to acquire interactive, stereoscopic magnetic resonance images, which includes an appropriate memory device encoded with pulse sequence software and interactive control software embodying and executing the functions of the pulse sequence control means and interactive control means disclosed herein.

Another embodiment of the invention provides a method for interactively acquiring stereoscopic magnetic resonance signals from an object in a magnetic resonance imaging apparatus for display in real or near-real time. The preferred method comprises several steps, a first of which includes executing a first predetermined pulse sequence for applying a static magnetic field, a slice-selection gradient magnetic field, a phase-encoding gradient magnetic field, a readout gradient magnetic field, and a radio frequency pulse to the object, so as to obtain a first magnetic resonance signal representing a first planar slice of the object. The method further includes executing a second predetermined pulse sequence for applying a static magnetic field, a slice-selection gradient magnetic field, a phase-encoding gradient magnetic field, a readout gradient magnetic field, and a radio frequency pulse to the object to obtain a second magnetic resonance signal representing a second planar slice of the object. Pursuant to the invention, the first and second planar slices represent a stereo pair formed by varying the slice-selection gradient magnetic field or the readout gradient magnetic field applied during the execution of the first and second predetermined pulse sequences. The method also includes the steps of detecting the first and second magnetic resonance signals, and constructing an image from each of the detected magnetic resonance signals, wherein the images together form a stereo pair.

Another preferred embodiment of the invention provides a system for acquiring an image representing an object in a magnetic resonance imaging apparatus. The preferred system of the invention includes static field means for applying a static magnetic field to the object, slice-selection gradient field means for applying a slice-selection magnetic gradient field to the object, phase-encoding gradient field means for applying a phase-encoding gradient magnetic field to the object, readout gradient field means for applying a readout gradient magnetic field to the object, radio frequency transmitting means for transmitting a radio pulse to the object, and magnetic resonance signal detection means for detecting magnetic resonance signals from the object. As a further component, this system includes pulse sequence control means for controlling the several above-noted gradient field means, the radio frequency transmitting means, and the magnetic resonance signal detection means, to obtain first and a second magnetic resonance signals representing a first and second slices of the object, wherein the first and second slices represent a stereo pair formed by varying the slice-selection gradient magnetic field or the readout gradient magnetic field applied during the execution of first and second predetermined pulse sequences. Processing means are also provided, for processing the magnetic resonance signals to construct an image from each, wherein the images together form a stereo pair.

Additional objects, features and advantages of the invention will be apparent from the following description.

DESCRIPTION OF THE PREFERRED EMBODIMENTS

Figure 1:
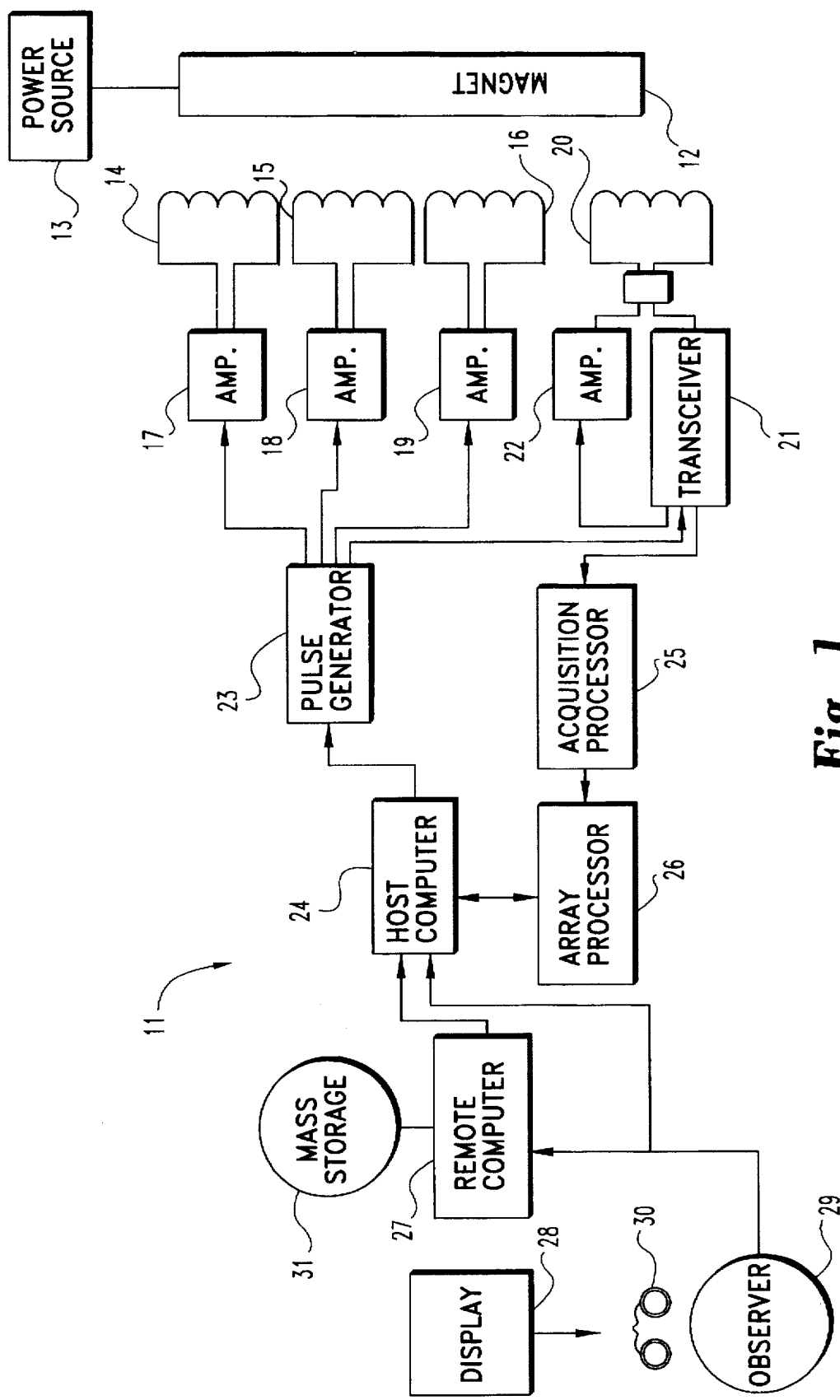
FIG. 1 is a schematic diagram illustrating a preferred interactive stereoscopic magnetic resonance imaging system of the invention.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated devices, and such further applications of the principles of the invention as illustrated therein being contemplated as would normally occur to one skilled in the art to which the invention pertains.

As indicated above, preferred embodiments of the invention relate to systems and methods for the real time or near real time acquisition and display of stereoscopic images generated using a magnetic resonance imaging (MRI) apparatus. In this regard, as illustrated in FIG. 1, the components of the MRI apparatus 11 generally include a static field magnet 12 for generating a static magnetic field, which magnet 12 as illustrated represents an electromagnet such as a superconducting magnet, but which can also be provided by a permanent magnet such as one fashioned from ceramic or high-carbon iron or rare earth alloys. MRI apparatus 11 also includes a power source 13 for the electromagnet 12.

Gradient coils 14, 15 and 16 are also provided for generating gradient magnetic fields to code position information into the MRI signal and enable the development of images representing slices of a predetermined portion of an object under study. These may be denoted, for example, as X-axis, Y-axis and Z-axis fields which may serve as slicing, phase-encoding and readout gradient fields. Power amplifiers 17, 18 and 19 supply currents to coils 14, 15 and 16, respectively. A radiofrequency (RF) coil 20 is provided, and can serve both to transmit RF pulses to the object and to detect magnetic resonance signals from the object. For these purposes RF coil is associated with an RF transceiver 21 and an amplifier 22 as illustrated.

A pulse generator 23 is coupled to each of the coils 14, 15, 16 and 20. The pulse generator 23 is in turn controlled by the host computer 24 (or a remote computer 27) of the MRI apparatus 11 equipped with pulse sequence software. In cooperation with amplifiers 17, 18, 19 and 22 and coils 14, 15, 16 and 20, the pulse sequence software executes pulse sequences to generate MR signals. The generated MR signals are detected at the RF coil 20 and transceiver 21 communicates data to an acquisition processor 25 associated with an array processor 26 ultimately connected to the host computer 24.

In accordance with a preferred aspect of the invention, the MRI apparatus 11 also includes one or more remote computers 27 connected to the host computer 24 via hardware and software for high-speed communication, such as Ethernet. Remote computer(s) 27 can serve, for example, as remote control, processing and/or display computers. Either the host computer 24 or a remote computer 27 is equipped with hardware and/or software for reconstructing stereoscopic image pairs from the detected MR data, e.g. by fourier transformation, and for displaying the image pairs. For example, a stereoscopic video display device 28 can be linked to a remote computer 27 (or in the absence of a remote computer to host computer 24) and in accordance with the discussions below displays stereoscopic MR images in real or near-real time. These stereoscopic images can then be viewed by an observer 29 through an appropriate pair of goggles 30, for example polarizing, color filter, or active shutter goggles, suitably LCD-shutter goggles. Observer may be, for instance, a physician performing an MRI-guided, invasive procedure such as a catheterization, biopsy or stereotactic surgery.

A mass storage device 31 can be operably coupled to remote computer(s) 27 and/or to the host computer 24. The mass storage device 31 is useful for temporary storage of raw data and computed images, and particularly for recording the results of extended viewing sessions for later replay.

In accordance with the invention the host computer 24 and/or a remote computer 27 is equipped with software means embodying a pulse sequence for stereoscopic MRI. This pulse sequence may represent any suitable imaging technique, including for example spin-warp, gradient-echo (also sometimes referred to as "field-echo"), and echo-planar techniques. The execution of this pulse sequence in the MRI apparatus will provide MR signals representing stereo pairs, which can be processed and viewed in real time or near-real time (within a few seconds, say about 10 seconds or less, more preferably about 5 seconds or less) when a sufficiently fast image acquisition technique, such as a gradient-echo, echo-planar or rotating projection image technique, is utilized.

Figure 2:
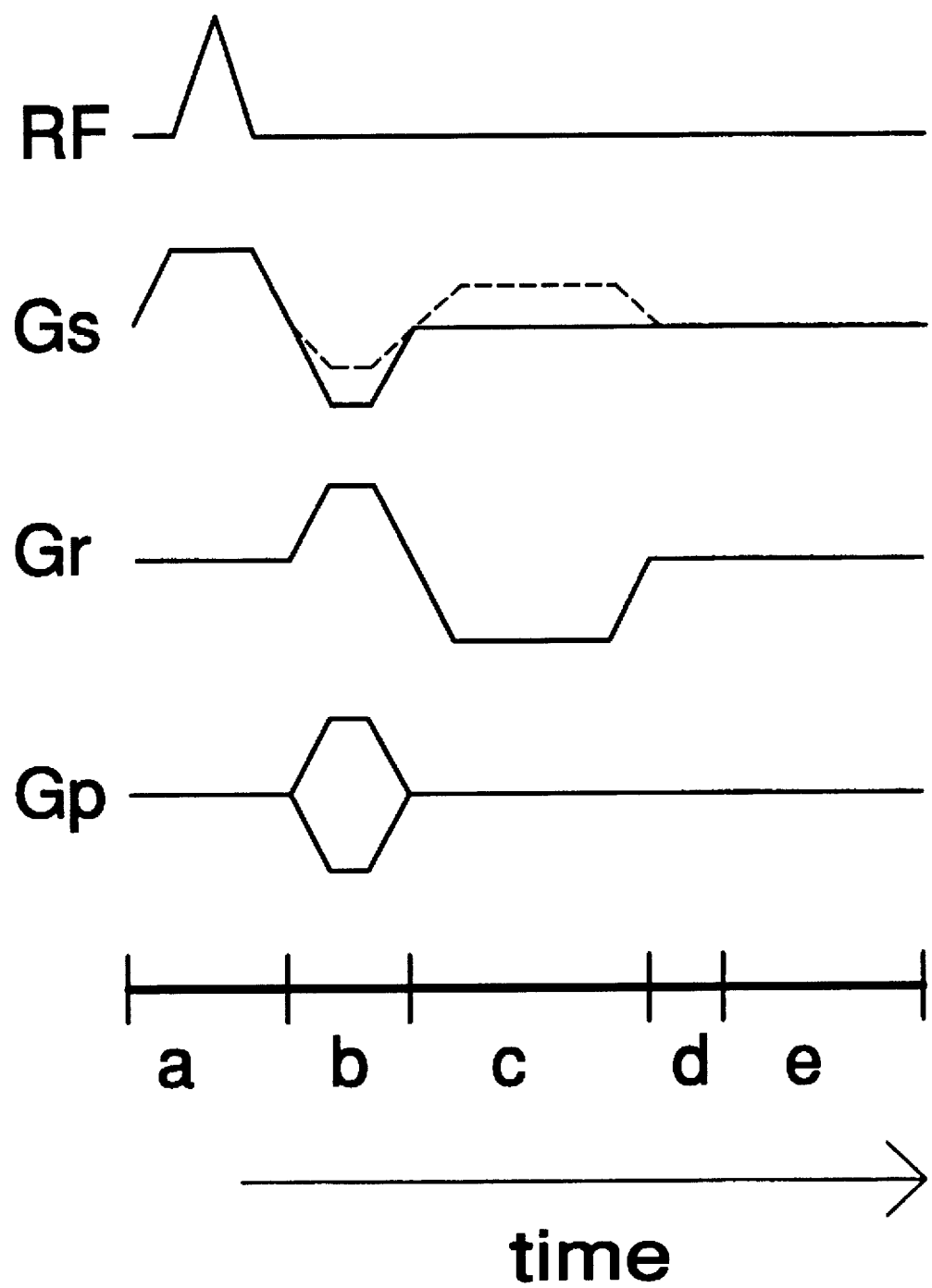
FIG. 2 is a timing diagram (schematic pulse sequence) for the generation of stereoscopic magnetic resonance images, wherein the view is tilted during the readout interval in a gradient-recalled-echo image acquisition scheme.
Figure 3:
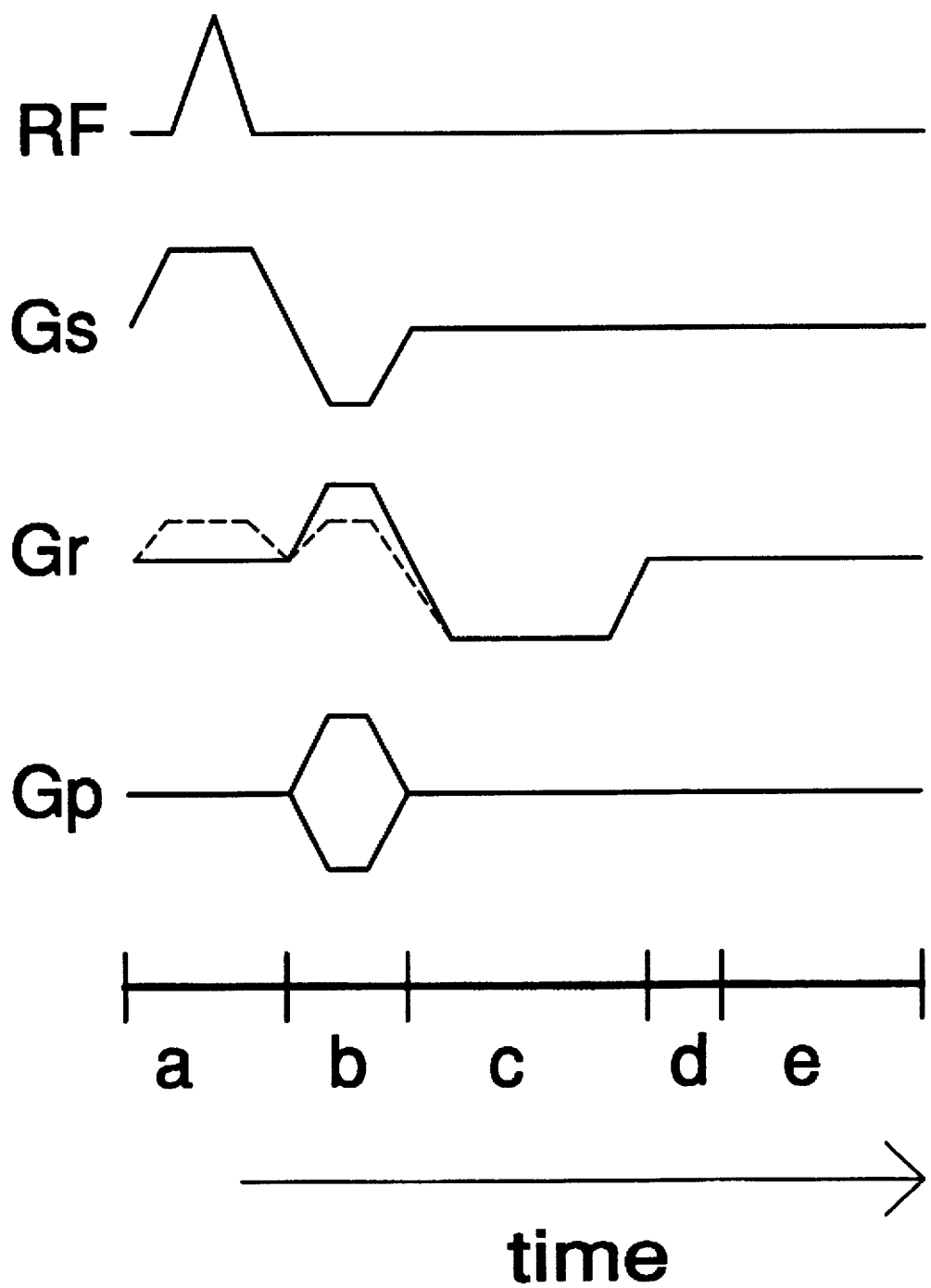
FIG. 3 is a timing diagram (schematic pulse sequence) for the generation of stereoscopic magnetic resonance images, wherein the view is tilted during the slice interval in a gradient-recalled-echo image acquisition scheme.

The stereo pairs generated in the present invention will be images of a portion of the object under study. To provide the illusion of stereoscopic vision (two views of the portion from slightly different perspectives), the direction of the readout gradient or the slice gradient can be changed slightly on alternate frames. For instance, this can be accomplished as illustrated in FIGS. 2 and 3. In these Figures, RF denotes the shaped RF pulse for slice selection (no particular shape is implied). Gs, Gr and Gp are, respectively, the slice-selection gradient, readout gradient and phase-encoding gradient, the latter of which takes on N different values during the acquisition of a stereo pair, wherein N is the number of lines (phase-encodings) in the image. Interval a is the slice selection interval, interval b is the phase-encoding and phase-compensation interval, and interval c is the readout interval. During this c interval the MR signal is digitized. During interval d, the instrument controller is updated with the interactively adjustable parameters inputted by a user (e.g. observer 29, FIG. 1) to alter the pulse sequence so as to alter the displayed visual information. Such alterations can include, for example, parameters such as view angle, contrast parameters, field of view, position, flip angle, repetition time, and resolution. An operator can thus use this interactive character of the inventive systems and methods to augment visual information with other cues such as apparent motion into or out of the plane, changes in contrast and brightness, or additional views from other directions or at different magnifications.

Interval e is the relaxation interval. During this e interval, additional gradient or RF pulses can be applied, for example to serve as spoiler, rewinder or suppression pulses, and such pulses will not interfere with the interactive stereoscopic imaging scheme of the invention.

Referring now particularly to FIG. 2, shown is a timing diagram for a stereoscopic imaging sequence based on a gradient-recalled echo scheme, although it will be understood that the principles illustrated in FIG. 2 can also readily be applied to other imaging techniques such as spin echo, echo-planar, etc. As can be seen from FIG. 2, the readout gradient can be changed by adding a small gradient (represented by the dotted line) in the perpendicular direction (the slice direction in this case) simultaneous with the readout gradient. In this manner, the stereoscopic "tilt" angle, i.e. the angle between alternate frames, is then arctan (Gs/Gr) evaluated during the readout period (interval c). The stereoscopic "tilt" can be omitted or inverted in sense (by changing the sign of the additional gradient) on alternate acquisitions, which represent "left" or "right" views of the reconstructed, displayed images. In this regard, the "left" and "right" images can be interleaved (aa' bb' cc' dd' . . . where the prime (') denotes the change of the slice select gradient), or a complete block of phase encodings of each type can be acquired.

The angle of tilt generated as discussed above will control the sensation of depth in the image conferred to the viewer. Typical values for such angle are about 6 degrees, although it may range from 1 degree to more than 20 degrees depending upon the preference of the viewer. In accordance with a preferred feature of the invention the MRI apparatus 11 (FIG. 1) will be equipped to allow the viewer to adjust the tilt angle while viewing in real time. This can be accomplished, for example, by equipping a remote computer 27 or the host computer 24 with appropriate interactive control software which enables on the fly alteration of the pulse sequence. This interactive software is advantageously voice-recognition software, although manual input devices, e.g. keyboards, may also be used.

The changes input by the user are recognized during update interval d and used to update the executed pulse sequence so as to provide the desired alteration of the displayed visual information. In this regard, in the preferred system the updates are made so as to impart a change in the displayed visual information in real or near-real time. For these purposes, the update can be made for instance after data acquisition for a line or after data acquisition for a frame.

FIG. 3 is another timing diagram for a stereoscopic imaging sequence based on a gradient-recalled echo scheme, in which intervals a, b, c, d and e are generally the same as those discussed above in connection with FIG. 2. As with FIG. 2, it will be understood that the principles illustrated in FIG. 3 can be used with other MR imaging schemes. In the scheme of FIG. 3, a tilt angle is introduced during slice selection. This is accomplished by adding a small gradient (represented by the dotted line) in the perpendicular direction (the readout direction in this case) simultaneous with the slice gradient. The resultant stereoscopic "tilt" angle is then arctan (Gr/Gs) evaluated during the slice period (interval a). As before, the stereoscopic "tilt" can be omitted or inverted in sense on alternate acquisitions, which represent "left" or "right" views. Again, the "left" and "right" images can be interleaved, or a complete block of phase encodings of each type can be acquired. Real-time, interactive adjustment of the tilt angle, preferably by voice recognition, can be provided as disclosed above.

In preferred MRI systems of the invention, in addition to interactive control of the "tilt" angle, real or near real-time control of other parameters of the image, including contrast parameters, field of view, position, and the like, are provided. This is advantageously provided by equipping a remote computer and/or the host computer (27 and/or 24, FIG. 1), with the NCSA "CAVE" virtual reality display system linked to an appropriate voice-recognition program. The system can then be programmed to execute predetermined changes in the displayed images in response to corresponding voice commands. Such interactive control provides dramatically improved visual cues while also allowing the user to implement "hands-free" image changes, an important feature especially where the user is conducting or participating in an interventional procedure such as an MRI-assisted catheterization or biopsy.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. An interactive, stereoscopic magnetic resonance imaging system for acquiring and displaying in real or near-real time a stereoscopic display of magnetic resonance signals acquired from an object, the system comprising:

static field means for applying a static magnetic field to the object;

slice-selection gradient field means for applying a slice-selection magnetic gradient to the object;

phase-encoding gradient field means for applying a phase-encoding gradient magnetic field to the object;

readout gradient field means for applying a readout gradient magnetic field to the object;

radio frequency transmitting means for transmitting a radio pulse to the object;

magnetic resonance signal detection means for detecting magnetic resonance signals from the object;

pulse sequence control means for controlling said slice-selection gradient field means, phase-encoding gradient field means, readout gradient field means, radio frequency transmitting means, and magnetic resonance signal detection means, to acquire magnetic resonance signals representing first and second planar slices of the object, said first and second planar slices representing stereo pairs;

interactive control means for controlling said pulse sequence control means to modify said magnetic resonance imaging signals in real or near-real time;

processing means for processing the magnetic resonance signals to construct a stereoscopic image of the object in real or near-real time;

display means for displaying said stereoscopic image in real or near-real time; and wherein modification of said magnetic resonance imaging signals by said interactive control means causes a modification of said stereoscopic display in real or near-real time.

2. The system of claim 1, wherein the pulse sequence control means executes a pulse sequence corresponding to a spin-warp, gradient-echo or echo-planar method.

3. The system of claim 2, wherein said pulse sequence corresponds to a gradient-echo method.

4. The system of claim 1, wherein said interactive control means comprises voice recognition software, and wherein said interactive control means is operable to execute predetermined modifications to said magnetic resonance signals in response to voice commands.

5. The system of claim 1, wherein said interactive control means are operable to modify said magnetic resonance signal to effect a change in field of view, view angle, contrast parameters, position, flip angle and/or resolution.

6. The system of claim 5, wherein said interactive control means comprise voice recognition software, and wherein said interactive control means is operable to execute predetermined modifications to said magnetic resonance signals in response to voice commands.

7. A method for interactively acquiring stereoscopic magnetic resonance signals from an object in a magnetic resonance imaging apparatus for display in real or near-real time, the method comprising:

executing a predetermined pulse sequence for applying a static magnetic field, gradient magnetic fields and a radio frequency pulse to the object to obtain magnetic resonance signals which can be used to construct a stereoscopic image of a portion of the object which can be displayed in real or near-real time;

executing interactive control means for modifying said predetermined pulse sequence to alter said magnetic resonance imaging signals in real or near-real time;

processing the magnetic resonance signals to construct a stereoscopic image of the object which is altered by said interactive control means in real or near-real time;

displaying said altered stereoscopic image in real or near-real time.

8. The method of claim 7, wherein the pulse sequence corresponds to a spin-warp, gradient-echo or echo-planar method.

9. The method of claim 8, wherein the pulse sequence corresponds to a gradient-echo method.

10. The method of claim 7, wherein said interactive control means comprises voice recognition software, and wherein said interactive control means executes a predetermined modification to said pulse sequence in response to a voice command.

11. The method of claim 7, wherein said interactive control means executes a predetermined modification to said pulse sequence to provide a change in field of view, view angle, contrast parameters, position, flip angle and/or resolution of the displayed stereoscopic image.

12. A system for acquiring an image representing an object in a magnetic resonance imaging apparatus, comprising:

static field means for applying a static magnetic field to the object;

slice-selection gradient field means for applying a slice-selection magnetic gradient to the object;

phase-encoding gradient field means for applying a phase-encoding gradient magnetic field to the object;

readout gradient field means for applying a readout gradient magnetic field to the object;

radio frequency transmitting means for transmitting a radio pulse to the object;

magnetic resonance signal detection means for detecting magnetic resonance signals from the object;

pulse sequence control means for controlling said slice-selection gradient field means, phase-encoding gradient field means, readout gradient field means, radio frequency transmitting means, and magnetic resonance signal detection means, to obtain first and second magnetic resonance signals representing first and second planar slices of the object;

said first and second planar slices representing a stereo pair formed by varying the slice-selection gradient magnetic field or the readout gradient magnetic field applied during the execution of first and second pedetermined pulse sequences;

interactive control means for controlling said pulse sequence control means to modify said magnetic resonance imaging signals in real or near-real time; and processing means for processing the magnetic resonance signals to construct an image of each and wherein said images together form a stereo pair.

13. The system of claim 12, wherein the pulse sequence control means is operable to execute a pulse sequence corresponding to a spin-warp, gradient-echo or echo-planar method.

14. The system of claim 13, wherein said pulse sequence corresponds to a gradient-echo method.

15. The system of claim 14, wherein said interactive control means comprise voice recognition software.

16. The system of calim 14, wherein said interactive control means are operable to modify said magnetic resonance signals to effect a change in field of view, view angle, contrast parameters, position, flip angle and/or resolution.

17. The system of claim 16, wherein said interactive control means comprise voice recognition software.

* * * * *

UNITED STATES PATENT AND TRADEMARK OFFICE
CERTIFICATE OF CORRECTION

PATENT NO. : 5,708,359
DATED : January 13, 1998
INVENTOR(S) : Carl D. Gregory et al.

It is certified that error appears in the above-indentified patent and that said Letters Patent is hereby corrected as shown below:

Column 1, line 5,

--This invention was made with Government support under Contracts NSF STC DIR-89-20133 awarded by National Science Foundation and NIH PHS-5-P41-RR05964 awarded by National Institutes of Health. The government has certain rights in this invention.--

Signed and Sealed this

Twenty-third Day of June, 1998

Attest:

BRUCE LEHMAN

Attesting Officer

Commissioner of Patents and Trademarks